(12) United States Patent
Zhang et al.

(10) Patent No.: US 10,903,646 B2
(45) Date of Patent: Jan. 26, 2021

(54) ELECTROSTATIC PROTECTION CIRCUIT

(71) Applicant: HUAWEI TECHNOLOGIES CO., LTD., Guangdong (CN)

(72) Inventors: Haichao Zhang, Shenzhen (CN); Ying Xiong, Shenzhen (CN); Zhi Xiao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 180 days.

(21) Appl. No.: 16/320,853

(22) PCT Filed: Jul. 26, 2016

(86) PCT No.: PCT/CN2016/091806
§ 371 (c)(1),
(2) Date: Jan. 25, 2019

(87) PCT Pub. No.: WO2018/018436
PCT Pub. Date: Feb. 1, 2018

(65) Prior Publication Data
US 2019/0165570 A1    May 30, 2019

(51) Int. Cl.
*H02H 9/02* (2006.01)
*H02H 9/00* (2006.01)
(Continued)

(52) U.S. Cl.
CPC ......... *H02H 9/025* (2013.01); *H01L 27/0288* (2013.01); *H02H 9/004* (2013.01); *H02H 9/046* (2013.01); *H05K 9/0067* (2013.01)

(58) Field of Classification Search
CPC ............ H02H 9/00; H02H 9/02; H02H 9/025; H02H 9/004; H02H 9/046; H02H 9/026;
(Continued)

(56) References Cited

U.S. PATENT DOCUMENTS 4,245,270 A    1/1981   Busby
5,991,134 A    11/1999  Tan et al.
(Continued)

FOREIGN PATENT DOCUMENTS

CN     1455453 A      11/2003
CN     100337501 C     9/2007
(Continued)

OTHER PUBLICATIONS

Chinese Office Action issued in Chinese Application No. 201680059126.3 dated Feb. 1, 2019, 5 pages.
(Continued)

*Primary Examiner* — Gary L Laxton
(74) *Attorney, Agent, or Firm* — Fish & Richardson P.C.

(57) ABSTRACT

The present disclosure relates to electrostatic protection terminals. One example terminal includes a target interface, a protected circuit, a protection unit, a switch unit, and a switch control unit. The protected circuit is configured to suppress an electrostatic discharge (ESD) current or an electrical overstress (EOS) current. A first end of the protection unit is electrically connected to a first pin of the target interface. A second end of the protection unit is electrically connected to a second pin of the protected circuit. The first pin is any pin of the target interface. The second pin is a pin that is in the protected circuit and that needs to be electrically connected to the first pin. The switch unit is connected to the protection unit in parallel. The switch control unit is configured to control the switch unit to be open or closed.

17 Claims, 4 Drawing Sheets

(51) Int. Cl.
*H01L 27/02* (2006.01)
*H02H 9/04* (2006.01)
*H05K 9/00* (2006.01)

(58) Field of Classification Search
CPC ........ H02H 9/041; H02H 9/042; H02H 9/043; H01L 27/0288; H05K 9/0067
See application file for complete search history.

(56) References Cited

U.S. PATENT DOCUMENTS

| | | | |
|---|---|---|---|
| 7,597,572 B2 | 10/2009 | Chapman et al. | |
| 7,872,840 B1* | 1/2011 | Vashchenko | G11C 16/30 |
| | | | 361/56 |
| 8,898,363 B2 | 11/2014 | Saarinen et al. | |
| 2007/0024327 A1 | 2/2007 | Howe et al. | |
| 2007/0025038 A1* | 2/2007 | Biagi | G11C 8/20 |
| | | | 361/90 |
| 2007/0053121 A1* | 3/2007 | Chang | H02H 9/046 |
| | | | 361/56 |
| 2007/0296279 A1 | 12/2007 | Wang et al. | |
| 2011/0060926 A1 | 3/2011 | Brooks et al. | |
| 2013/0182356 A1 | 7/2013 | Yang et al. | |
| 2014/0376134 A1* | 12/2014 | Hunter | H02H 9/044 |
| | | | 361/56 |
| 2015/0188312 A1* | 7/2015 | Kwok | H02H 9/04 |
| | | | 361/88 |
| 2015/0245546 A1* | 8/2015 | Lin | H01G 17/00 |
| | | | 361/56 |

FOREIGN PATENT DOCUMENTS

| | | |
|---|---|---|
| CN | 101364731 A | 2/2009 |
| CN | 101854058 A | 10/2010 |
| CN | 102082430 A | 6/2011 |
| CN | 102437563 A | 5/2012 |
| CN | 102545192 A | 7/2012 |
| CN | 103532117 A | 1/2014 |
| CN | 104252437 A | 12/2014 |

OTHER PUBLICATIONS

International Search Report and Written Opinion issued in International Application No. PCT/CN2016/091806 dated Apr. 19, 2017, 20 pages.

Extended European Search Report issued in European Application No. 16910017.9 dated Jun. 28, 2019, 8 pages.

* cited by examiner

ELECTROSTATIC PROTECTION CIRCUIT

CROSS-REFERENCE TO RELATED APPLICATIONS

This application is a National Stage of International Application No. PCT/CN2016/091806, filed on Jul. 26, 2016, which is hereby incorporated by reference in its entirety.

TECHNICAL FIELD

This application relates to the field of electrostatic protection technologies, and in particular, to an electrostatic protection circuit.

BACKGROUND

As an ultra-large scale integrated circuit technology is continuously improved, a size of a MOS (Metal Oxide Semiconductor, metal-oxide semiconductor) component gradually decreases, and a thickness of a gate oxide layer of the MOS component becomes thinner accordingly. Consequently, a voltage endurance capability of the MOS component decreases greatly, and damage caused by an electrostatic discharge (Electrostatic Discharge, ESD) to a chip that includes an integrated circuit increases. Currently, at least one chip exists in each terminal. Without electrostatic protection, the chip in the terminal is to be easily damaged by an electrostatic discharge.

To enhance an electrostatic protection capability, an input/output interface end of a chip is usually connected to an electrostatic protection circuit. The electrostatic protection circuit provides, for an internal circuit in the chip, a discharge path of an electrostatic current, so as to avoid static electricity from breaking down the internal circuit.

In an existing electrostatic protection circuit, a component such as a resistor is generally connected in series on a port line of a protected circuit, so that static electricity or EOS (Electrical Overstress, electrical overstress) is suppressed. However, in such electrostatic protection circuit, a load resistor is introduced to a transmission line, and a transmission rate of data in the line is affected.

SUMMARY

Embodiments of this application provide an electrostatic protection circuit, so as to provide an electrostatic protection circuit that does not affect a transmission rate of a transmission line.

An embodiment of this application provides an electrostatic protection circuit, including:

a protection unit, configured to suppress an electrostatic discharge ESD current or an electrical overstress EOS current, where a first end of the protection unit is electrically connected to a first pin of a target interface, a second end of the protection unit is electrically connected to a second pin of a protected circuit, the first pin is any pin of the target interface, and the second pin is a pin that is in the protected circuit and that needs to be electrically connected to the first pin;

a switch unit, connected to the protection unit in parallel; and a switch control unit, configured to control the switch unit to be open or closed, where an input end of the switch control unit is electrically connected to a power pin or a control signal pin of the protected circuit, and an output end of the switch control unit is electrically connected to a control end of the switch unit.

According to the circuit provided in this embodiment of this application, at a moment when a peripheral is electrically connected to the target interface, electrostatic charge may be discharged by using the protection unit, so that the ESD current or the EOS current is suppressed, thereby implementing an electrostatic protection function for the protected circuit. In addition, after the electrostatic charge is discharged by using the protection unit, the switch control unit controls the switch unit to short-circuit the protection unit, so that the protection unit is isolated when the protected circuit normally works, and a transmission rate of a transmission line between the first pin and the second pin is unaffected.

Optionally, the protection unit includes a resistor; and
a first end of the resistor is the first end of the protection unit, and a second end of the resistor is the second end of the protection unit.

Optionally, the switch unit includes a first P-channel metal oxide semiconductor PMOS transistor and a second PMOS transistor; and
a source electrode of the first PMOS transistor is electrically connected to a source electrode of the second PMOS transistor; a gate electrode of the first PMOS transistor is electrically connected to a gate electrode of the second PMOS transistor, to form the control end of the switch unit; a drain electrode of the first PMOS transistor is electrically connected to the first end of the resistor; and a drain electrode of the second PMOS transistor is electrically connected to the second end of the resistor.

Optionally, the switch control unit includes an N-channel metal oxide semiconductor NMOS transistor; and
a drain electrode of the NMOS transistor is used as the output end of the switch control unit and is electrically connected to the control end; a source electrode of the NMOS transistor is grounded; and a gate electrode of the NMOS transistor is used as the input end of the switch control unit and is electrically connected to the power pin or the control signal pin of the protected circuit.

Optionally, the switch unit includes an analog switch; and
a first end of the analog switch is electrically connected to the first end of the resistor, and a second end of the analog switch is electrically connected to the second end of the resistor.

Optionally, the switch control unit includes a voltage detector; and
an output end of the voltage detector is used as the output end of the switch control unit and is electrically connected to the control end; a grounding end of the voltage detector is grounded; and an input end of the voltage detector is used as the input end of the switch control unit and is electrically connected to the power pin or the control signal pin of the protected circuit.

Optionally, the target interface is any type of the following interfaces:
a Universal Serial Bus USB interface;
a board to board BTB connector interface;
a headset interface;
a subscriber identity module SIM card interface; or
a secure digital SD card interface.

Optionally, when the target interface is electrically connected to a peripheral, the switch control unit controls, based on a level that is output by the power pin or the control signal pin and that is received by the input end of the switch control unit, the switch unit to be closed, so that the protection unit is short-circuited.

An embodiment of this application provides an electrostatic protection circuit, where the circuit includes:

a protection unit, configured to suppress an electrostatic discharge ESD current or an electrical overstress EOS current, where a first end of the protection unit is electrically connected to a first pin of a target interface, a second end of the protection unit is grounded, the first pin is any pin of the target interface, and the second pin is a pin that is in a protected circuit and that needs to be electrically connected to the first pin;

a switch unit, where a first end of the switch unit is electrically connected to the first pin, a second end of the switch unit is electrically connected to a second pin of a protected circuit, and the second pin is a pin that is in the protected circuit and that needs to be electrically connected to the first pin; and a switch control unit, configured to control the switch unit to be open or closed, where an input end of the switch control unit is electrically connected to a power pin or a control signal pin of the protected circuit, and an output end of the switch control unit is electrically connected to a control end of the switch unit.

According to the circuit provided in this embodiment of this application, at a moment when a peripheral is electrically connected to the target interface, electrostatic charge may be discharged by using the protection unit, so that the ESD current or the EOS current is suppressed, thereby implementing an electrostatic protection function for the protected circuit. In addition, after the electrostatic charge is discharged by using the protection unit, the switch control unit controls the switch unit to short-circuit the protection unit, so that the protection unit is isolated when the protected circuit normally works, and a transmission rate of a transmission line between the first pin and the second pin is unaffected.

Optionally, the protection unit includes a resistor; and a first end of the resistor is the first end of the protection unit, and a second end of the resistor is the second end of the protection unit.

Optionally, the switch unit includes a first P-channel metal oxide semiconductor PMOS transistor and a second PMOS transistor; and a source electrode of the first PMOS transistor is electrically connected to a source electrode of the second PMOS transistor; a gate electrode of the first PMOS transistor is electrically connected to a gate electrode of the second PMOS transistor, to form the control end of the switch unit; a drain electrode of the first PMOS transistor is electrically connected to the first pin; and a drain electrode of the second PMOS transistor is electrically connected to the second pin.

According to the foregoing circuit, there is a delay of several milliseconds when the PMOS transistor is conducted. After the first PMOS transistor and the second PMOS transistor are conducted, the resistor has completed discharging electrostatic charge, so that electrostatic protection can be implemented, and impact on the transmission line can be avoided.

Optionally, the switch control unit includes an N-channel metal oxide semiconductor NMOS transistor; and a drain electrode of the NMOS transistor is used as the output end of the switch control unit and is electrically connected to the control end; a source electrode of the NMOS transistor is grounded; and a gate electrode of the NMOS transistor is used as the input end of the switch control unit and is electrically connected to the power pin or the control signal pin of the protected circuit.

Optionally, the switch unit includes an analog switch; and a first end of the analog switch is electrically connected to the first pin, and a second end of the analog switch is electrically connected to the second pin.

Optionally, the switch control unit includes a voltage detector; and an output end of the voltage detector is used as the output end of the switch control unit and is electrically connected to the control end; a grounding end of the voltage detector is grounded; and an input end of the voltage detector is used as the input end of the switch control unit and is electrically connected to the power pin or the control signal pin of the protected circuit.

Optionally, the target interface is any type of the following interfaces:

a Universal Serial Bus USB interface;
a board to board BTB connector interface;
a headset interface;
a subscriber identity module SIM card interface; or
a secure digital SD card interface.

Optionally, when the target interface is electrically connected to a peripheral, the switch control unit controls, based on a level that is output by the power pin or the control signal pin and that is received by the input end of the switch control unit, the switch unit to be closed, so that the protection unit is short-circuited.

An embodiment of this application provides an electrostatic protection circuit, where the circuit includes:

a protection unit, configured to suppress an ESD current or an EOS current, where a first end of the protection unit is electrically connected to a first end of a dual-channel selector, and a second end of the protection unit is grounded;

the dual-channel selector, where a second end of the dual-channel selector is electrically connected to a second pin of a protected circuit, a common end of the dual-channel selector is electrically connected to a first pin of a target interface, the first pin is any pin of the target interface, and the second pin is a pin that is in the protected circuit and that needs to be electrically connected to the first pin; and a switch control unit, configured to: when an output end outputs a high level, control the second end of the dual-channel selector to be electrically connected to the common end of the dual-channel selector; or when an output end outputs a low level, control the first end of the dual-channel selector to be electrically connected to the common end of the dual-channel selector, where an input end of the switch control unit is electrically connected to a power pin or a control signal pin of the protected circuit, and the output end of the switch control unit is electrically connected to a control end of the dual-channel selector.

DESCRIPTION OF EMBODIMENTS

The following describes the embodiments of this application in detail with reference to the accompanying drawings in this specification.

A peripheral of a terminal is usually connected to the terminal by using an interface of the terminal. For example, the peripheral such as a mouse or a keyboard may be connected to the terminal by using a USB (Universal Serial Bus, Universal Serial Bus) interface. For another example, a SIM (Subscriber Identification Module, subscriber identity module) card may be connected to the terminal by using a SIM card interface. Static electricity is easily generated in a process of inserting or removing the peripheral in the terminal that supports hot plug. Without protection measures, the generated static electricity may damage an interface chip that is inside the terminal and that is connected to the interface of the terminal. Correspondingly, static electricity generated in the interface chip may also damage the peripheral of the terminal.

It should be noted that the terminal in the embodiments of this application may be a wireless terminal, or a wired terminal. For example, the terminal may be a computer, a mobile phone, a tablet computer, or the like.

Therefore, an electrostatic protection circuit needs to be provided, to perform electrostatic protection on the interface chip in the terminal and the peripheral of the terminal.

Figure 1:
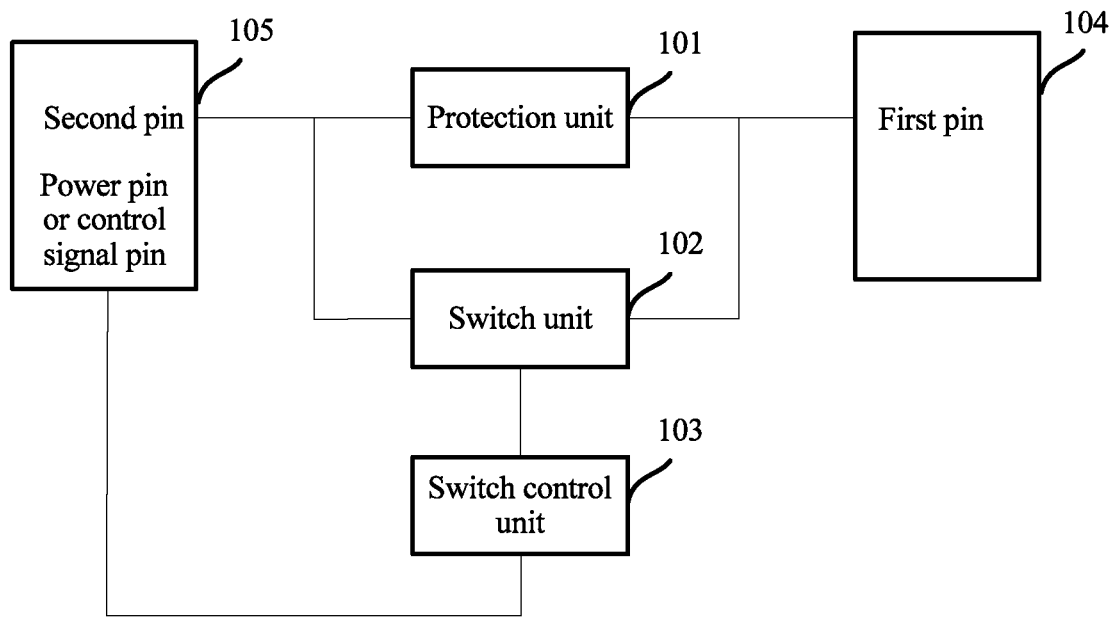
FIG. 1 is a schematic structural diagram of an electrostatic protection circuit according to Embodiment 1 of this application.

Based on the foregoing description, as shown in FIG. 1, FIG. 1 is a schematic structural diagram of an electrostatic protection circuit according to Embodiment 1 of this application.

As shown in FIG. 1, the circuit specifically includes:

a protection unit 101, configured to suppress an ESD current or an EOS current, where a first end of the protection unit 101 is electrically connected to a first pin of a target interface 104, a second end of the protection unit 101 is electrically connected to a second pin of a protected circuit 105, the first pin is any pin of the target interface 104, and the second pin is a pin that is in the protected circuit 105 and that needs to be electrically connected to the first pin;

a switch unit 102, connected to the protection unit 101 in parallel; and a switch control unit 103, configured to control the switch unit 102 to be open or closed, where an input end of the switch control unit 103 is electrically connected to a power pin or a control signal pin of the protected circuit 105, and an output end of the switch control unit 103 is electrically connected to a control end of the switch unit 102.

It should be noted that, at a moment when a peripheral is electrically connected to the target interface 104, the input end of the switch control unit 103 may receive a high level by using the power pin, or receive the high level by using the control signal pin.

It should be noted that in this embodiment of this application, if the ESD current or the EOS current needs to be suppressed at each pin of the target interface 104, the protection circuit shown in FIG. 1 may be configured for each pin, and a pin in the target interface 104 that requires configuration of the protection circuit may be specifically determined according to an actual situation. This embodiment of this application imposes no limitation herein.

In this embodiment of this application, when the target interface 104 is not connected to a peripheral, the switch unit 102 remains in an open state. In addition, the switch control unit 104 is not powered on, and cannot control the switch unit 102.

In this embodiment of this application, at the moment when the peripheral is electrically connected to the target interface 104, a channel is formed between the peripheral and the protected circuit 105, and the power pin of the protected circuit 105 outputs the high level, so as to supply power to the peripheral. Alternatively, at the moment when the peripheral is electrically connected to the target interface 104, a channel is formed between the peripheral and the protected circuit 105, and because the peripheral is detected, the control signal pin of the protected circuit 105 outputs the high level.

With reference to the foregoing description, at the moment when the peripheral is electrically connected to the target interface 104, the input end of the switch control unit 103 receives the high level by using the power pin or the control signal pin, and in addition, the protection unit 101 is electrically connected to the peripheral by using the first pin. In this case, electrostatic charge may be discharged by using the protection unit 101, so that the ESD current or the EOS current is suppressed, thereby implementing an electrostatic protection function for the protected circuit inside the terminal. This process lasts for several milliseconds approximately.

In addition, there is a delay of several milliseconds between the moment at which the peripheral is electrically connected to the target interface 104 and a moment at which the switch control unit 103 controls the switch unit 102 to be closed. Therefore, when the electrostatic charge is discharged by using the protection unit 101, the switch unit 102 still remains in the open state, so that a channel among the first pin, the protection unit 101, and the second pin is formed. When the switch control unit 103 controls the switch unit 102 to be closed, the protection unit 101 is short-circuited, so that a channel among the first pin, the switch unit 102, and the second pin is formed, and the first pin is electrically connected to the second pin. Because an on resistance of the switch unit 102 is relatively low, and a resistance is generally milliohms (from a few milliohms to dozens of milliohms), a signal transmitted between the first pin and the second pin is unaffected.

It should be noted that in this embodiment of this application, the target interface 104 may be any type of the following interfaces:

a USB interface;

a BTB (board to board connector, board to board connector) interface, where the BTB interface may be any type of BTB interface, such as a BTB interface on a camera or a BTB interface on a fingerprint recognition module;

a headset interface;

a SIM card; or an SD (Secure Digital, secure digital) card interface.

Correspondingly, the protected circuit 105 may be determined according to an actual situation. For example, the protected circuit 105 may be a power management chip, a CPU (Central Processing Unit, central processing unit), a storage chip, or the like, and no more examples are enumerated herein for description.

In this embodiment of this application, the protection unit 101 may include a resistor. A first end of the resistor is the first end of the protection unit 101, and a second end of the resistor is the second end of the protection unit 101.

It should be noted that a resistance value of the resistor may be determined according to an actual situation, and details are not described herein.

At the moment when the peripheral is connected to the target interface 104, the resistor in the protection unit 101 may limit a maximum current peak in an electrostatic discharge, thereby implementing the electrostatic protection function for the protected circuit 105 inside the terminal.

In this embodiment of this application, the switch unit 102 may have a plurality of implementations. In a possible implementation, the switch unit 102 includes a first PMOS (P-channel Metal Oxide Semiconductor, P-channel metal oxide semiconductor) transistor and a second PMOS transistor.

A source electrode of the first PMOS transistor is electrically connected to a source electrode of the second PMOS transistor; a gate electrode of the first PMOS transistor is electrically connected to a gate electrode of the second PMOS transistor, to form the control end of the switch unit; a drain electrode of the first PMOS transistor is electrically connected to the first end of the resistor; and a drain electrode of the second PMOS transistor is electrically connected to the second end of the resistor.

It should be noted that because the source electrode of the first PMOS transistor is electrically connected to the source electrode of the second PMOS transistor, the first PMOS transistor and a parasitic body diode in the second PMOS transistor are reversely connected in series, so as to prevent backflow of currents on left and right sides.

Correspondingly, in this embodiment of this application, the switch control unit 103 may have a plurality of implementations. In a possible implementation, the switch control unit 103 includes an NMOS (N-channel Metal Oxide Semiconductor, N-channel metal oxide semiconductor) transistor. A drain electrode of the NMOS transistor is used as the output end of the switch control unit 103 and is electrically connected to the control end; a source electrode of the NMOS transistor is grounded; and a gate electrode of the NMOS transistor is used as the input end of the switch control unit 103 and is electrically connected to the power pin or the control signal pin of the protected circuit 105.

Figure 2:
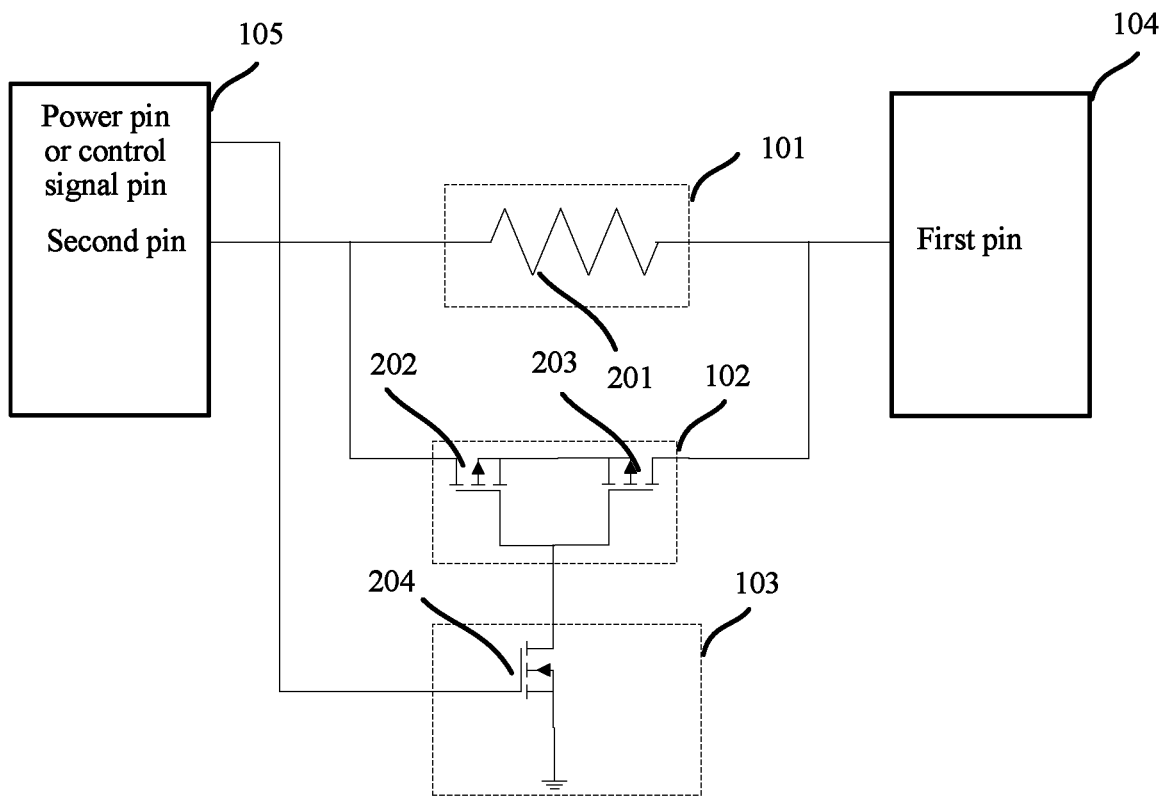
FIG. 2 is a schematic structural diagram of an electrostatic protection circuit according to Embodiment 1 of this application.

With reference to the foregoing description, as shown in FIG. 2, FIG. 2 is a schematic structural diagram of an electrostatic protection circuit according to Embodiment 1 of this application. In FIG. 2, the protection unit 101 may include a resistor 201; the switch unit 102 includes a first PMOS transistor 202 and a second PMOS transistor 203; and the switch control unit 103 includes an NMOS transistor 204. For a connection relationship between the foregoing components, refer to the foregoing description. Details are not described herein. In FIG. 2, at the moment when the peripheral is electrically connected to the target interface 104, an input end of the NMOS transistor 204 receives the high level by using the power pin or the control signal pin of the protected circuit 105, and in addition, the resistor 201 is electrically connected to the peripheral by using the first pin. In this case, the electrostatic charge may be discharged by using the resistor 201, so that the ESD current or the EOS current is suppressed. When the electrostatic charge is discharged by using the resistor 201, the input end of the NMOS transistor 204 receives the high level, and a source electrode of the NMOS transistor 204 is grounded. In this case, the source electrode and a drain electrode of the NMOS transistor 204 are conducted, so that both a gate electrode of the first PMOS transistor 202 and a gate electrode of the second PMOS transistor 203 are grounded, both the first PMOS transistor 202 and the second PMOS transistor 203 are conducted, a channel is formed among the first pin, the first PMOS transistor 202, the second PMOS transistor 203, and the second pin, the resistor 201 is short-circuited, and the first pin is electrically connected to the second pin. There is a delay of several milliseconds when the NMOS transistor and the PMOS transistor are conducted. Therefore, after the NMOS transistor 204, the first PMOS transistor 202, and the second PMOS transistor 203 are sequentially conducted, the resistor 201 has completed discharging the electrostatic charge. By using the foregoing circuit, electrostatic protection can be implemented, and impact on a transmission line can be avoided.

In the foregoing circuit, at the moment when the peripheral is connected to the target interface 104, when a transient voltage exists at the first pin, because the first PMOS transistor 202 and the second PMOS transistor 203 are not conducted, a voltage drop can be generated on the resistor 201, so that the transient voltage is attenuated.

In another possible implementation, the switch unit 102 includes an analog switch. A first end of the analog switch is electrically connected to the first end of the resistor, and a second end of the analog switch is electrically connected to the second end of the resistor.

In another possible implementation, the switch control unit 103 includes a voltage detector. An output end of the voltage detector is used as the output end of the switch control unit 103 and is electrically connected to the control end of the switch unit 102; a grounding end of the voltage detector is grounded; and an input end of the voltage detector is used as the input end of the switch control unit 103 and is electrically connected to the power pin or the control signal pin of the protected circuit 105.

Optionally, the power pin or the control signal pin further includes a delay circuit, for example, an RC delay circuit.

It should be noted that the voltage detector may be selected according to an actual situation, for example, a voltage detector of a CN1185 TSSOP16 model, a voltage detector of an HT7133-1 model, or the like may be selected, and no more examples are enumerated herein for description.

Figure 3:
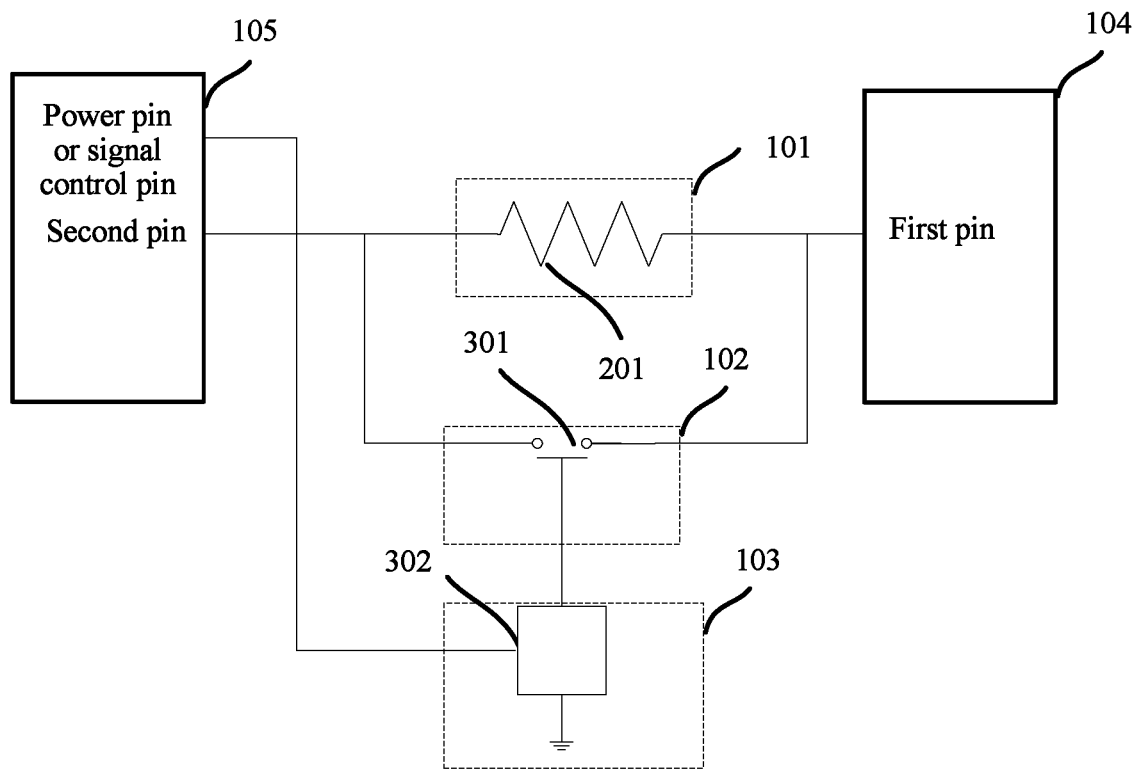
FIG. 3 is a schematic structural diagram of an electrostatic protection circuit according to Embodiment 1 of this application.

With reference to the foregoing description, as shown in FIG. 3, FIG. 3 is a schematic structural diagram of an electrostatic protection circuit according to Embodiment 1 of this application. In FIG. 3, the protection unit 101 may include the resistor 201; the switch unit 102 includes an analog switch 301; and the switch control unit 103 includes a voltage detector 302. For a connection relationship between the foregoing components, refer to the foregoing description. Details are not described herein. In FIG. 3, at the moment when the peripheral is electrically connected to the target interface 104, an input end of the voltage detector 302 receives the high level by using the power pin or the control signal pin of the protected circuit, and in addition, the resistor 201 is electrically connected to the peripheral by using the first pin. In this case, the electrostatic charge may be discharged by using the resistor 201, so that the ESD current or the EOS current is suppressed. When the electrostatic charge is discharged by using the resistor 201, the input end of the voltage detector 302 receives the high level. In this case, the input end of the voltage detector 302 detects a voltage, so that an output end of the voltage detector 302 outputs a high level signal of the detected voltage. The high level signal that is output by the output end of the voltage detector 302 enables the analog switch 301 to be closed, so that a channel among the first pin, the analog switch 301, and the second pin is formed, and the resistor 201 is short-circuited. There is a delay of several milliseconds in outputting the high level signal when the voltage detector 302 detects the voltage. Therefore, after the analog switch 301 is closed, the resistor 201 has completed discharging the electrostatic charge. By using the foregoing circuit, electrostatic protection can be implemented, and impact on a transmission line can be avoided.

Figure 4:
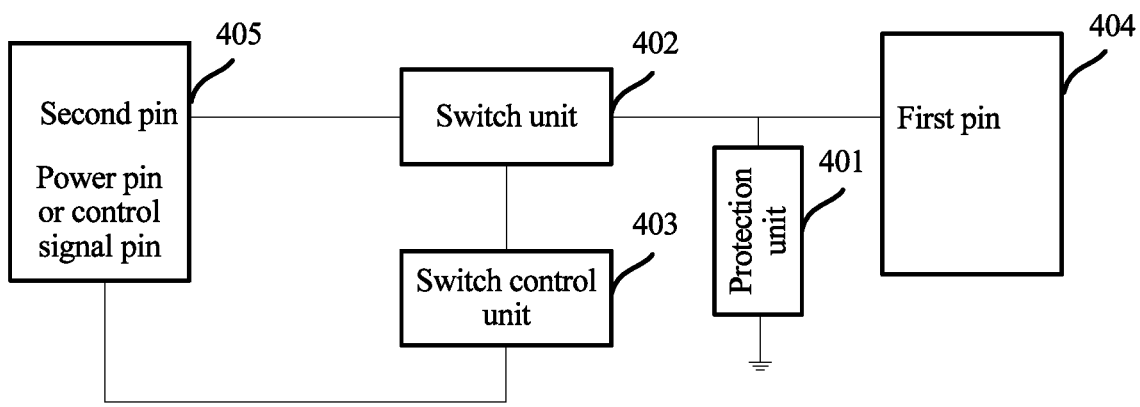
FIG. 4 is a schematic structural diagram of an electrostatic protection circuit according to Embodiment 2 of this application.

As shown in FIG. 4, FIG. 4 is a schematic structural diagram of an electrostatic protection circuit according to Embodiment 2 of this application.

As shown in FIG. 4, the circuit specifically includes:

a protection unit 401, configured to suppress an ESD current or an EOS current, where a first end of the protection unit 401 is electrically connected to a first pin of a target interface 404, a second end of the protection unit 401 is grounded, and the first pin is any pin of the target interface 404;

a switch unit 402, where a first end of the switch unit 402 is electrically connected to the first pin, a second end of the switch unit 402 is electrically connected to a second pin of a protected circuit 405, and the second pin is a pin that is in the protected circuit 405 and that needs to be electrically connected to the first pin; and a switch control unit 403, configured to control the switch unit 402 to be open or closed, where an input end of the switch control unit 403 is electrically connected to a power pin or a control signal pin of the protected circuit 405, and an output end of the switch control unit 403 is electrically connected to a control end of the switch unit 402.

Optionally, the power pin or the control signal pin further includes a delay circuit, for example, an RC delay circuit.

It should be noted that in this embodiment of this application, if the ESD current or the EOS current needs to be suppressed at each pin of the target interface 404, the protection circuit shown in FIG. 4 may be configured for each pin, and a pin in the target interface 404 that requires configuration of the protection circuit may be specifically determined according to an actual situation. This embodiment of this application imposes no limitation herein.

In this embodiment of this application, when the target interface 404 is not connected to a peripheral, the switch unit 402 remains in an open state. In addition, the switch control unit 403 is not powered on, and cannot control the switch unit 402.

In this embodiment of this application, the power pin of the protected circuit 405 outputs a high level, so as to supply power to the peripheral. Alternatively, when detecting the peripheral, the protected circuit 405 outputs the high level by using the control signal pin.

With reference to the foregoing description, at a moment when the peripheral is electrically connected to the target interface 404, if static electricity is introduced by the peripheral to the target interface 404, electrostatic charge may be discharged to ground by using the protection unit 401. In addition, there is a delay of several milliseconds between the moment at which the peripheral is electrically connected to the target interface 404 and a moment at which the switch control unit 403 controls the switch unit 402 to be closed. Therefore, when the electrostatic charge is discharged by using the protection unit 401, the switch unit 402 still remains in the open state, so that a disconnection is formed between the first pin and the second pin, thereby implementing an electrostatic protection function for the protected circuit inside a terminal. When the switch control unit 403 controls the switch unit 402 to be closed, the protection unit 401 is short-circuited, so that a channel among the first pin, the switch unit 402, and the second pin is formed, and the first pin is electrically connected to the second pin. Because an on resistance of the switch unit 402 is relatively low, and a resistance is generally milliohms (from a few milliohms to dozens of milliohms), a signal transmitted between the first pin and the second pin is unaffected.

It should be noted that in this embodiment of this application, the target interface 404 may be any type of the following interfaces:

a USB interface;

a BTB interface, where the BTB interface may be any type of BTB interface, such as a BTB interface on a camera or a BTB interface on a fingerprint recognition module;

a headset interface;

a SIM card; or an SD card interface.

Correspondingly, the protected circuit may be determined according to an actual situation. For example, the protected circuit may be a power management chip, a CPU, a storage chip, or the like, and no more examples are enumerated herein for description.

In this embodiment of this application, the protection unit 401 may include a resistor. A first end of the resistor is the first end of the protection unit 401, and a second end of the resistor is the second end of the protection unit 401.

It should be noted that a resistance value of the resistor may be determined according to an actual situation, and details are not described herein.

In this embodiment of this application, the switch unit 402 may have a plurality of implementations. In a possible implementation, the switch unit 402 includes a first PMOS transistor and a second PMOS transistor.

A source electrode of the first PMOS transistor is electrically connected to a source electrode of the second PMOS transistor; a gate electrode of the first PMOS transistor is electrically connected to a gate electrode of the second PMOS transistor, to form the control end of the switch unit; a drain electrode of the first PMOS transistor is electrically connected to the first pin; and a drain electrode of the second PMOS transistor is electrically connected to the second pin.

It should be noted that because the source electrode of the first PMOS transistor is electrically connected to the source electrode of the second PMOS transistor, the first PMOS transistor and a parasitic body diode in the second PMOS transistor are reversely connected in series, so as to prevent backflow of currents on left and right sides.

Correspondingly, in this embodiment of this application, the switch control unit 403 may have a plurality of implementations. In a possible implementation, the switch control unit 403 includes an NMOS transistor. A drain electrode of the NMOS transistor is used as the output end of the switch control unit and is electrically connected to the control end; a source electrode of the NMOS transistor is grounded; and a gate electrode of the NMOS transistor is used as the input end of the switch control unit and is electrically connected to the power pin or the control signal pin of the protected circuit.

Figure 5:
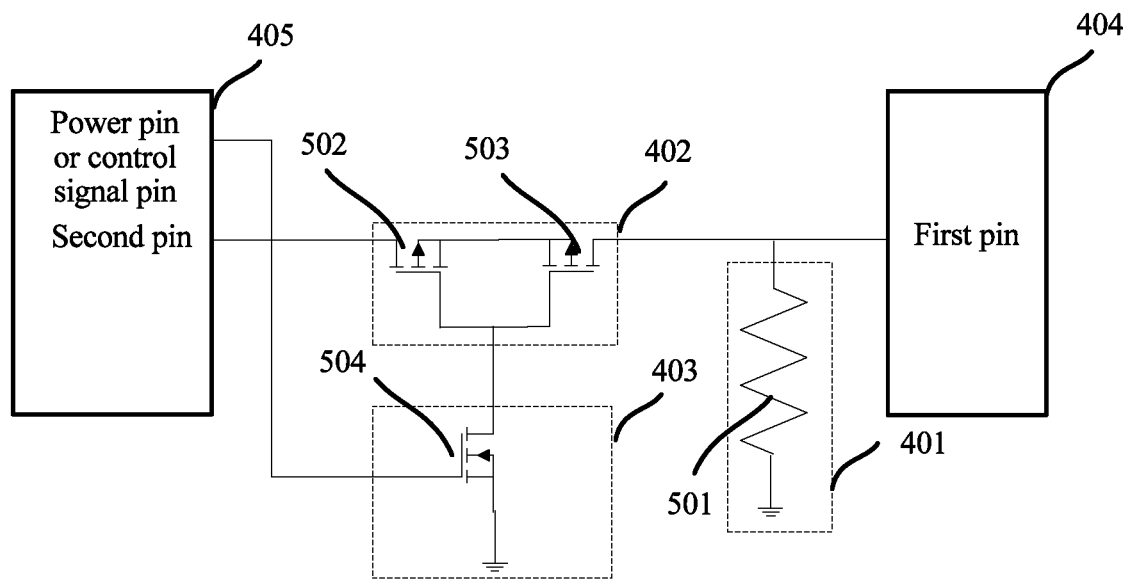
FIG. 5 is a schematic structural diagram of an electrostatic protection circuit according to Embodiment 2 of this application.

With reference to the foregoing description, as shown in FIG. 5, FIG. 5 is a schematic structural diagram of an electrostatic protection circuit according to Embodiment 2 of this application. In FIG. 5, the protection unit 401 may include a resistor 501; the switch unit 402 includes a first PMOS transistor 502 and a second PMOS transistor 503; and the switch control unit 403 includes an NMOS transistor 504. For a connection relationship between the foregoing components, refer to the foregoing description. Details are not described herein. In FIG. 5, at the moment when the peripheral is electrically connected to the target interface 404, the resistor 501 is electrically connected to the peripheral by using the first pin. In this case, the electrostatic charge may be discharged to ground by using the resistor 501, so that the ESD current or the EOS current is suppressed. When the electrostatic charge is discharged by using the resistor 501, an input end of the NMOS transistor 504 receives the high level by using the power pin or the control signal pin, and a source electrode of the NMOS transistor 504 is grounded. In this case, the source electrode and a drain electrode of the NMOS transistor 504 are conducted. Because both a gate electrode of the first PMOS transistor 502 and a gate electrode of the second PMOS transistor 503 are grounded, both the first PMOS transistor 502 and the second PMOS transistor 503 are conducted, a channel is formed among the first pin, the first PMOS transistor 502, the second PMOS transistor 503, and the second pin, and the first pin is electrically connected to the second pin. There is a delay of several milliseconds when the NMOS transistor and the PMOS transistor are conducted. Therefore, after the NMOS transistor 504, the first PMOS transistor 502, and the second PMOS transistor 503 are sequentially conducted, the resistor 501 has completed discharging the electrostatic charge. By using the foregoing circuit, electrostatic protection can be implemented, and impact on a transmission line can be avoided.

In the foregoing circuit, at the moment when the peripheral is connected to the target interface 404, when a transient voltage exists at the first pin, because the first PMOS transistor 502 and the second PMOS transistor 503 are not conducted, a voltage drop can be generated on the resistor 501, so that the transient voltage is attenuated.

In another possible implementation, the switch unit 402 includes an analog switch. A first end of the analog switch is electrically connected to the first pin, and a second end of the analog switch is electrically connected to the second pin.

In another possible implementation, the switch control unit 403 includes a voltage detector. An output end of the voltage detector is used as the output end of the switch control unit and is electrically connected to the control end; a grounding end of the voltage detector is grounded; and an input end of the voltage detector is used as the input end of the switch control unit and is electrically connected to the power pin or the control signal pin of the protected circuit.

It should be noted that the voltage detector may be selected according to an actual situation, for example, a voltage detector of a CN1185 TSSOP16 model, a voltage detector of an HT7133-1 model, or the like may be selected, and no more examples are enumerated herein for description.

Figure 6:
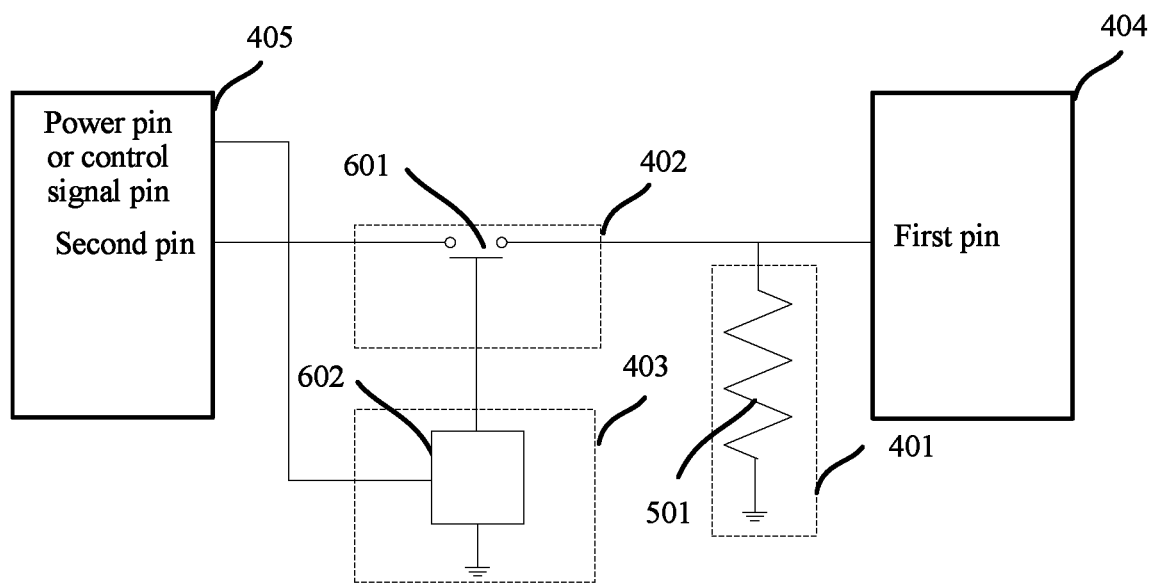
FIG. 6 is a schematic structural diagram of an electrostatic protection circuit according to Embodiment 2 of this application.

With reference to the foregoing description, as shown in FIG. 6, FIG. 6 is a schematic structural diagram of an electrostatic protection circuit according to Embodiment 2 of this application. In FIG. 6, the protection unit 401 may include the resistor 501; the switch unit 402 includes an analog switch 601; and the switch control unit 403 includes a voltage detector 602. For a connection relationship between the foregoing components, refer to the foregoing description. Details are not described herein. In FIG. 3, at the moment when the peripheral is electrically connected to the target interface 404, the resistor 501 is electrically connected to the peripheral by using the first pin. In this case, the electrostatic charge may be discharged by using the resistor 501, so that the ESD current or the EOS current is suppressed. When the electrostatic charge is discharged by using the resistor 501, an input end of the voltage detector 602 receives the high level by using the power pin or the control signal pin. In this case, the input end of the voltage detector 602 detects a voltage, so that an output end of the voltage detector 602 outputs a high level signal of the detected voltage. The high level signal that is output by the output end of the voltage detector 602 enables the analog switch 601 to be closed, so that a channel among the first pin, the analog switch 601, and the second pin is formed. There is a delay of several milliseconds in outputting the high level signal when the voltage detector 602 detects the voltage. Therefore, after the analog switch 601 is closed, the resistor 501 has completed discharging the electrostatic charge. By using the foregoing circuit, electrostatic protection can be implemented, and impact on a transmission line can be avoided.

Figure 7:
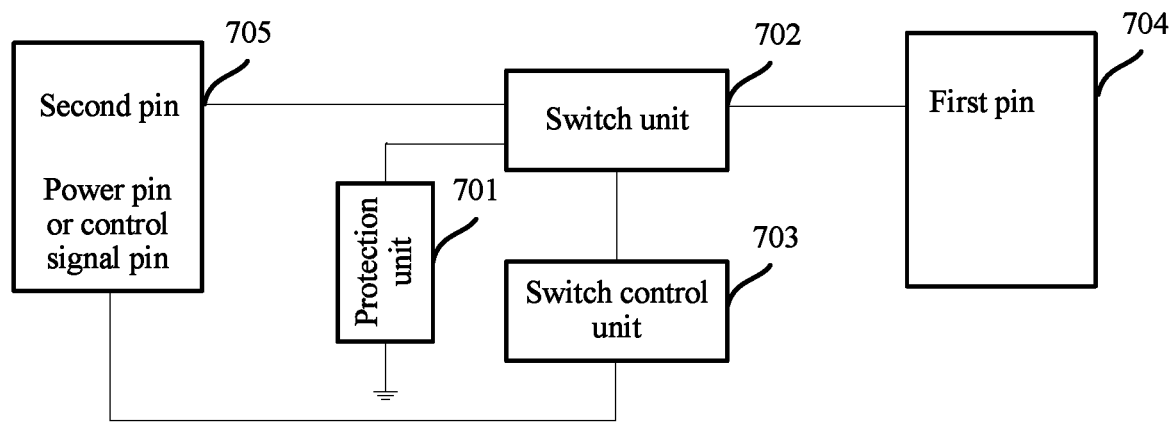
FIG. 7 is a schematic structural diagram of an electrostatic protection circuit according to Embodiment 3 of this application.

As shown in FIG. 7, FIG. 7 is a schematic structural diagram of an electrostatic protection circuit according to Embodiment 3 of this application.

As shown in FIG. 7, the circuit specifically includes:

a protection unit 701, configured to suppress an ESD current or an EOS current, where a first end of the protection unit 701 is electrically connected to a first end of a switch unit 702, and a second end of the protection unit 702 is grounded;

the switch unit 702, where a second end of the switch unit 702 is electrically connected to a second pin of a protected circuit 705, a third end of the switch unit 702 is electrically connected to a first pin of a target interface 704, the first pin is any pin of the target interface 704, and the second pin is a pin that is in the protected circuit 705 and that needs to be electrically connected to the first pin; and a switch control unit 703, configured to: when an output end outputs a high level, control the second end of the switch unit 702 to be electrically connected to the third end of the switch unit 702; or when an output end outputs a low level, control the first end of the switch unit 702 to be electrically connected to the third end of the switch unit 702, where an input end of the switch control unit 703 is electrically connected to a power pin or a control signal pin of the protected circuit 705, and the output end of the switch control unit 703 is electrically connected to a control end of the switch unit 702.

In this embodiment of this application, when the target interface 704 is not connected to a peripheral, the switch control unit 703 is not powered on, that is, the output end of the switch control unit 703 outputs a low level. In this case, the first end of the switch unit 702 is electrically connected to the third end of the switch unit 702, and a channel is formed among the first pin, the switch unit 702, and the protection unit. The power pin of the protected circuit 705 outputs a high level, so as to supply power to the peripheral. Alternatively, when detecting the peripheral, the protected circuit 705 outputs the high level by using the control signal pin.

With reference to the foregoing description, at a moment when the peripheral is electrically connected to the target interface 704, there is a delay of several milliseconds between the moment at which the peripheral is electrically connected to the target interface 704 and a moment at which the switch control unit 703 controls the second end of the switch unit 702 to be electrically connected to the third end of the switch unit 702. Therefore, static electricity that is introduced by the peripheral to the target interface 704 may be discharged to ground by using the channel among the first pin, the switch unit 702, and the protection unit 701. When electrostatic charge is discharged by using the protection unit 701, the input end of the switch control unit 703 is powered on by using the power pin or the control signal pin. In this case, the output end of the switch control unit 703 outputs the high level, so that the second end of the switch unit 702 is controlled to be electrically connected to the third end of the switch unit 702, a channel is formed among the first pin, the switch unit 702, and the second pin, and a disconnection is formed among the first pin, the switch unit 702, and the protection unit 701. Because an on resistance of the switch unit 702 is relatively low, and is usually from a few milliohms to dozens of milliohms, data transmission is unaffected.

It should be noted that in this embodiment of this application, the target interface 704 may be any type of the following interfaces:

a USB interface;

a BTB interface, where the BTB interface may be any type of BTB interface, such as a BTB interface on a camera or a BTB interface on a fingerprint recognition module;

a headset interface;

a SIM card; or an SD card interface.

Correspondingly, the protected circuit may be determined according to an actual situation. For example, the protected circuit may be a power management chip, a CPU, a storage chip, or the like, and no more examples are enumerated herein for description.

In this embodiment of this application, the protection unit 701 may include a resistor. A first end of the resistor is the first end of the protection unit 701, and a second end of the resistor is the second end of the protection unit 701.

It should be noted that a resistance value of the resistor may be determined according to an actual situation, and details are not described herein.

In this embodiment of this application, the switch unit 702 may include a dual-channel selector. A first end of the dual-channel selector is electrically connected to the first end of the protection unit 701, a second end of the dual-channel selector is electrically connected to the second pin, a common end of the dual-channel selector is electrically connected to the first pin, and a selection end of the dual-channel selector is used as the control end of the switch unit 702 and is electrically connected to the output end of the switch control unit 703. The first end of the dual-channel selector is an end that is selected when the selection end of the dual-channel selector receives a low level, and the second end of the dual-channel selector is an end that is selected when the selection end of the dual-channel selector receives the high level.

In this embodiment of the present invention, the switch control unit 703 may include a voltage detector. An output end of the voltage detector is used as the output end of the switch control unit and is electrically connected to the control end; a grounding end of the voltage detector is grounded; and an input end of the voltage detector is used as the input end of the switch control unit and is electrically connected to the power pin or the control signal pin of the protected circuit.

It should be noted that the voltage detector may be selected according to an actual situation, for example, a voltage detector of a CN1185 TSSOP16 model, a voltage detector of an HT7133-1 model, or the like may be selected, and no more examples are enumerated herein for description.

Figure 8:
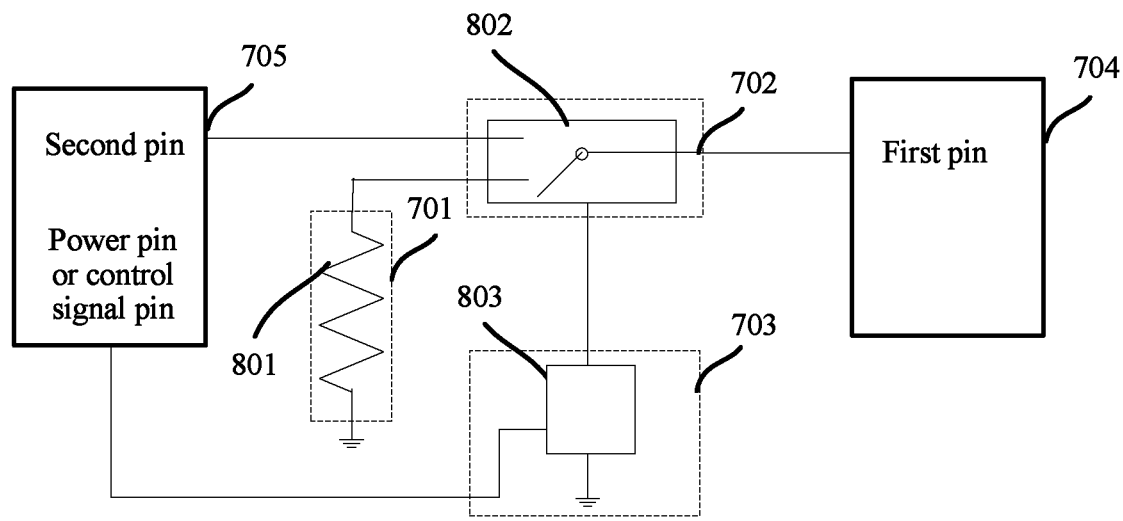
FIG. 8 is a schematic structural diagram of an electrostatic protection circuit according to Embodiment 3 of this application.

With reference to the foregoing description, as shown in FIG. 8, FIG. 8 is a schematic structural diagram of an electrostatic protection circuit according to Embodiment 3 of this application. In FIG. 8, the protection unit 701 may include a resistor 801; the switch unit 702 includes a dual-channel selector 802; and the switch control unit 703 includes a voltage detector 803. For a connection relationship between the foregoing components, refer to the foregoing description. Details are not described herein. In FIG. 8, at the moment when the peripheral is electrically connected to the target interface 704, an input end of the voltage detector 803 is electrically connected to a power supply by using the power pin or the control signal pin, and in addition, the resistor 801 is electrically connected to the peripheral by using the first pin. There is a delay of several milliseconds in outputting the high level after the voltage detector 803 detects a voltage. Therefore, an output end of the voltage detector 803 outputs a low level during an electrostatic discharge, so that a first end of the dual-channel selector 802 is controlled to be connected to a common end of the dual-channel selector 802, a channel is formed among the first pin, the dual-channel selector 802, and the resistor 801, the electrostatic charge may be discharged to ground by using the resistor 801, and the ESD current or the EOS current is suppressed. After detecting the voltage and outputting the high level, the voltage detector 803 controls a second end of the dual-channel selector 802 to be electrically connected to the common end of the dual-channel selector 802, so that a channel is formed between the first pin, the dual-channel selector 802, and the second pin, a disconnection is formed among the first pin, the dual-channel selector 802, and the resistor 801, and the first pin is electrically connected to the second pin.

It should be noted that the voltage detector may be selected according to an actual situation, for example, a voltage detector of a CN1185 TSSOP16 model, a voltage detector of an HT7133-1 model, or the like may be selected, and no more examples are enumerated herein for description.

Obviously, persons skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A terminal, comprising:
a target interface;
a protected circuit;
a protection unit, the protection unit configured to suppress an electrostatic discharge (ESD) current or an electrical overstress (EOS) current, wherein a first end of the protection unit is electrically connected to a first pin of the target interface, wherein a second end of the protection unit is electrically connected to a second pin of the protected circuit, wherein the first pin is any pin of the target interface, and wherein the second pin is a pin that is in the protected circuit and that is electrically connected to the first pin;
a switch unit, the switch unit connected to the protection unit in parallel; and
a switch control unit, the switch control unit configured to control the switch unit to be open or closed, wherein an input end of the switch control unit is electrically connected to a power pin or a control signal pin of the protected circuit, wherein an output end of the switch control unit is electrically connected to a control end of the switch unit, and wherein at a moment when a peripheral is electrically connected to the target interface, electrostatic charge is discharged by using the protection unit, the switch control unit configured to control the switch unit to short-circuit the protection unit after the electrostatic charge is discharged.

2. The terminal according to claim 1, wherein the protection unit comprises a resistor; and
   wherein a first end of the resistor is the first end of the protection unit and a second end of the resistor is the second end of the protection unit.

3. The terminal according to claim 2, wherein the switch unit comprises a first P-channel metal oxide semiconductor (PMOS) transistor and a second PMOS transistor; and
   wherein a source electrode of the first PMOS transistor is electrically connected to a source electrode of the second PMOS transistor, a gate electrode of the first PMOS transistor is electrically connected to a gate electrode of the second PMOS transistor to form the control end of the switch unit, a drain electrode of the first PMOS transistor is electrically connected to the first end of the resistor, and a drain electrode of the second PMOS transistor is electrically connected to the second end of the resistor.

4. The terminal according to claim 3, wherein the switch control unit comprises an N-channel metal oxide semiconductor (NMOS) transistor; and
   wherein a drain electrode of the NMOS transistor is used as the output end of the switch control unit and is electrically connected to the control end, a source electrode of the NMOS transistor is grounded, and a gate electrode of the NMOS transistor is used as the input end of the switch control unit and is electrically connected to the power pin or the control signal pin of the protected circuit.

5. The terminal according to claim 2, wherein the switch unit comprises an analog switch; and
   wherein a first end of the analog switch is electrically connected to the first end of the resistor and a second end of the analog switch is electrically connected to the second end of the resistor.

6. The terminal according to claim 5, wherein the switch control unit comprises a voltage detector; and
   wherein an output end of the voltage detector is used as the output end of the switch control unit and is electrically connected to the control end, a grounding end of the voltage detector is grounded, and an input end of the voltage detector is used as the input end of the switch control unit and is electrically connected to the power pin or the control signal pin of the protected circuit.

7. The terminal according to claim 1, wherein the target interface is any type of the following interfaces:
   a Universal Serial Bus (USB) interface;
   a board to board (BTB) connector interface;
   a headset interface;
   a subscriber identity module (SIM) card interface; or
   a secure digital (SD) card interface.

8. The terminal according to claim 1, wherein when the target interface is electrically connected to a peripheral, the switch control unit controls, based on a level that is output by the power pin or the control signal pin and that is received by the input end of the switch control unit, the switch unit to be closed, so that the protection unit is short-circuited.

9. A terminal, comprising:
   a target interface;
   a protected circuit;
   a protection unit, the protection unit configured to suppress an electrostatic discharge (ESD) current or an electrical overstress EOS current, wherein a first end of the protection unit is electrically connected to a first pin of the target interface, wherein a second end of the protection unit is grounded, and wherein the first pin is any pin of the target interface;
   a switch unit, wherein a first end of the switch unit is electrically connected to the first pin, wherein a second end of the switch unit is electrically connected to a second pin of the protected circuit, and wherein the second pin is a pin that is in the protected circuit and that is electrically connected to the first pin; and
   a switch control unit, the switch control unit configured to control the switch unit to be open or closed, wherein an input end of the switch control unit is electrically connected to a power pin or a control signal pin of the protected circuit, and wherein an output end of the switch control unit is electrically connected to a control end of the switch unit;
   wherein at a moment when a peripheral is electrically connected to the target interface, electrostatic charge is discharged by using the protection unit, the switch control unit configured to control the switch unit to short-circuit the protection unit after the electrostatic charge is discharged.

10. The terminal according to claim 9, wherein the protection unit comprises a resistor; and
    wherein a first end of the resistor is the first end of the protection unit and a second end of the resistor is the second end of the protection unit.

11. The terminal according to claim 10, wherein the switch unit comprises a first P-channel metal oxide semiconductor (PMOS) transistor and a second PMOS transistor; and
    wherein a source electrode of the first PMOS transistor is electrically connected to a source electrode of the second PMOS transistor, a gate electrode of the first PMOS transistor is electrically connected to a gate electrode of the second PMOS transistor to form the control end of the switch unit, a drain electrode of the first PMOS transistor is electrically connected to the first pin, and a drain electrode of the second PMOS transistor is electrically connected to the second pin.

12. The terminal according to claim 11, wherein the switch control unit comprises an N-channel metal oxide semiconductor (NMOS) transistor; and
    wherein a drain electrode of the NMOS transistor is used as the output end of the switch control unit and is electrically connected to the control end, a source electrode of the NMOS transistor is grounded, and a gate electrode of the NMOS transistor is used as the input end of the switch control unit and is electrically connected to the power pin or the control signal pin of the protected circuit.

13. The terminal according to claim 10, wherein the switch unit comprises an analog switch; and
    wherein a first end of the analog switch is electrically connected to the first pin and a second end of the analog switch is electrically connected to the second pin.

14. The terminal according to claim 13, wherein the switch control unit comprises a voltage detector; and
    wherein an output end of the voltage detector is used as the output end of the switch control unit and is electrically connected to the control end, a grounding end of the voltage detector is grounded, and an input end of the voltage detector is used as the input end of the switch control unit and is electrically connected to the power pin or the control signal pin of the protected circuit.

15. The terminal according to claim 9, wherein the target interface is any type of the following interfaces:
   a Universal Serial Bus (USB) interface;
   a board to board (BTB) connector interface;
   a headset interface;
   a subscriber identity module (SIM) card interface; or
   a secure digital (SD) card interface.

16. The terminal according to claim 9, wherein when the target interface is electrically connected to a peripheral, the switch control unit controls, based on a level that is output by the power pin or the control signal pin and that is received by the input end of the switch control unit, the switch unit to be closed, so that the protection unit is short-circuited.

17. A terminal, comprising:
   a target interface;
   a protected circuit;
   a protection unit, the protection unit configured to suppress an ESD current or an EOS current, wherein a first end of the protection unit is electrically connected to a first end of a dual-channel selector, and wherein a second end of the protection unit is grounded; the dual-channel selector, wherein a second end of the dual-channel selector is electrically connected to a second pin of the protected circuit, wherein a common end of the dual-channel selector is electrically connected to a first pin of the target interface, wherein the first pin is any pin of the target interface, and wherein the second pin is a pin that is in the protected circuit and that is electrically connected to the first pin; and
   a switch control unit, the switch control unit configured to:
      when an output end outputs a first level, control the second end of the dual-channel selector to be electrically connected to the common end of the dual-channel selector; or
      when an output end outputs a second level, control the first end of the dual-channel selector to be electrically connected to the common end of the dual-channel selector, wherein the first level is higher than the second level, wherein an input end of the switch control unit is electrically connected to a power pin or a control signal pin of the protected circuit, and wherein the output end of the switch control unit is electrically connected to a control end of the dual-channel selector.

* * * * *